United States Patent [19]

Corley

[11] Patent Number: 5,770,681
[45] Date of Patent: Jun. 23, 1998

[54] MODIFIED BISIMIDE COMPOSITIONS

[75] Inventor: Larry Steven Corley, Houston, Tex.

[73] Assignee: Shell Oil Company, Houston, Tex.

[21] Appl. No.: 707,717

[22] Filed: May 30, 1991

Related U.S. Application Data

[63] Continuation-in-part of Ser. No. 545,745, Jun. 29, 1990, Pat. No. 5,086,139.

[51] Int. Cl.[6] .............................. C08G 73/10; C08F 22/40
[52] U.S. Cl. ........................ 528/322; 526/262; 526/335; 526/336; 524/548
[58] Field of Search ..................... 526/262, 335, 526/336; 528/322; 524/548

[56] References Cited

U.S. PATENT DOCUMENTS

| | | |
|---|---|---|
| 4,100,140 | 7/1978 | Zahir et al. ............................. 526/90 |
| 4,211,860 | 7/1980 | Stenzenberger ........................ 528/312 |
| 4,220,741 | 9/1980 | Renner et al. .......................... 525/422 |
| 4,288,583 | 9/1981 | Zahir et al. ............................. 526/262 |
| 4,518,754 | 5/1985 | Locatelli et al. ....................... 526/262 |
| 4,526,925 | 7/1985 | Parker et al. ........................... 524/548 |
| 4,642,329 | 2/1987 | Kirchhoff et al. ...................... 526/284 |
| 4,730,030 | 3/1988 | Hahn et al. ............................. 526/262 |
| 4,927,907 | 5/1990 | Corley .................................... 528/322 |
| 5,086,139 | 2/1992 | Corley .................................... 528/322 |

*Primary Examiner*—P. Hampton-Hightower

[57] ABSTRACT

The solution stability of a modified bisimide resin is enhanced by partially polymerizing a mixture of a bisimide monomer and a reactive triene which contains a conjugated double bond capable of Diels-Alder reaction with the bisimide. Such partial polymerization of a bisimide with a reactive triene such as myrcene provides a modified bisimide having good solubility in an organic solvent.

15 Claims, No Drawings

MODIFIED BISIMIDE COMPOSITIONS

RELATED APPLICATION

This application is a continuation-in-part of Ser. No. 545,745, filed Jun. 29, 1990, now U.S. Pat. No. 5,086,139.

BACKGROUND OF THE INVENTION

This invention relates to thermosettable bisimide compositions. In one aspect, the invention relates to the preparation of cured bismaleimide resins formulations which are processable in electrical laminating applications.

Thermosettable materials useful in high-performance electrical applications such as high-temperature circuit boards must meet a set of demanding property requirements. For example, such materials optimally have good high-temperature properties such as high (above 200° C.) cured glass transition temperature and low (less than 4%) water absorption elevated temperature. Such materials must also exhibit stable solubility in organic solvents such as acetone, as the preparation of electrical laminates conventionally involves impregnation of a porous glass web with a solution of the thermosettable resin. For ease of processing in preparing prepregs for composite parts, the uncured material will ideally have a low (below 120° C.) melting temperature and a wide temperature range of processable viscosity (a wide "processing window").

Bismaleimide resins have good high-temperature properties which make them candidates for electrical laminates. Bismaleimides, however, are typically quite brittle and they are not readily soluble in inexpensive organic solvents.

Standard modifiers for bismaleimides have a number of disadvantages. Some, such as styrene, divinylbenzene, diisopropenylbenzene and certain derivatives thereof, are extremely reactive with maleimide groups by both Diels-Alder and radical mechanisms. This leads to a very short pot life for bismaleimide mixtures with these reactive diluents. These materials, while providing more easily processable bismaleimide resins, tend to be ineffective as tougheners for the resins. Diamines and dithiols generally share this disadvantage of high reactivity, and also the adducts of maleimide groups with amines or thiols are of somewhat low thermal stability. Other diluent modifiers, such as bisallyl, bis(allyloxy) or bispropenyl aromatic compounds, including diallyl bisphenol-A and adducts of allylphenols with epoxy resins, are somewhat less reactive than the vinyl aromatics but still have a pot life in the melt which is relatively short for many types of liquid processing applications.

It is therefore an object of the invention to provide bisimide resin compositions having good physical properties and enhanced processability for electrical laminating applications.

BRIEF SUMMARY OF THE INVENTION

According to the invention, a curable bisimide solution is provided comprising a partially-cured bisimide and a reactive triene which is characterized by a conjugated diene moiety capable of unhindered Diels-Alder reaction with the bisimide and an isolated double bond. According to a specific aspect of the invention, a process is provided for stabilizing the solubility of a bisimide/myrcene composition, the process comprising subjecting the bisimide and the myrcene to conditions effective to partially-cure the composition and thereby increase its melt viscosity at 150° C. to at least about 0.5 Pa.s. The resulting partially-cured composition has good processability, good cured properties and enhanced solubility in organic solvents.

DETAILED DESCRIPTION OF THE INVENTION

The invention composition includes a bisimide. Preferred bisimides include N,N'-bisimides of unsaturated dicarboxylic acids which can be represented by the formula

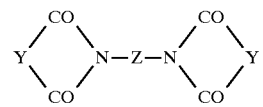

in which Y is a substituted or unsubstituted divalent group containing at least 2 carbon atoms, preferably 2 to 6 carbon atoms, and a carbon-carbon double bond, and Z is a divalent radical comprising at least 1, generally about 1 to 40 carbon atoms. Z can be aliphatic, cycloaliphatic, aromatic or heterocyclic. A preferred class of bisimides are difunctional bismaleimides derived from an aromatic diamine which can be represented by the formula

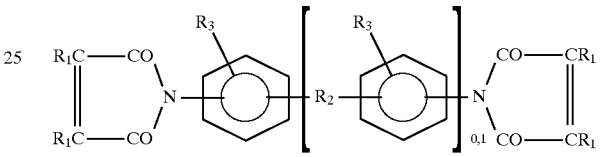

in which each $R_1$ is selected independently from H, $C_{1-2}$ alkyl or halide; $R_2$ is selected from divalent hydrocarbon radicals containing from about 1 to about 10 carbon atoms, —O—, —SO$_2$O—, —COO—, —CONH—, —CO— and —S—; and each $R_3$ is selected independently from H, $C_{1-3}$ alkyl and halide.

Specific examples of bisimides include 1,2-bismaleimidoethane
1,6-bismaleimidohexane
1,3-bismaleimidobenzene
1,4-bismaleimidobenzene
2,4-bismaleimidotoluene
4,4'-bismaleimidodiphenylmethane
4,4'-bismaleimidodiphenylether
3,3'-bismaleimidodiphenylsulfone
4,4'-bismaleimidodiphenylsulfone
4,4'-bismaleimidodicyclohexylmethane
3,5-bis(4-maleimidophenyl)pyridine
2,6-bismaleimidopyridine
1,3-bis(maleimidomethyl)cyclohexane
1,3-bis(maleimidomethyl)benzene
1,1-bis(4-maleimidophenyl)cyclohexane
1,3-bis(dichloromaleimido)benzene
4,4'-biscitraconimidodiphenylmethane
2,2-bis(4-maleimidophenyl)propane
1-phenyl-1,1-bis(4-maleimidophenyl)ethane
α,α-bis(4-maleimidophenyl)toluene
3,5-bismaleimido-1,2,4-triazole and various bismaleimides disclosed in U.S. Pat. Nos. 3,562,223, 4,211,860 and 4,211,861. Bismaleimides can be prepared by methods known in the art, as described in U.S. Pat. No. 3,018,290, for example.

The bismaleimide resin can contain imide oligomer according to the formula

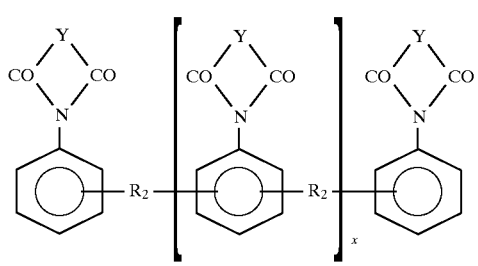

in which x is a number within the range of about 0 to about 0.5. Such oligomers may be present as an impurity in difunctional bisimides.

The preferred bisimide resin is N,N'-4,4'-diphenylmethane bismaleimide. The bisimide can contain various additives and modifiers as processing aids. The bisimide resin component can be a reaction product or prepolymer of a bisimide and an effective chain-extending agent such as an amine group-containing compound. Suitable amine group-containing compounds include diamines and polyamines represented by the general formula $(H_2N)_nQ$ or $(RNH)_nQ$ and aminophenols represented by the general formula $(NH_2)_nQ(OH)_n$ or $(RNH)_nQ(OH)_n$, in which Q is a divalent aromatic or alicyclic group and n is a number such that the average number of amine hydrogens per molecule in the amine mixture falls between about 1.95 and 2.5. Examples include bis(4-(N-methylamino)phenyl)methane, N,N'-dimethyl-1,3-diaminobenzene and the like. Such reaction products can be prepared by methods known in the art, such as contacting about 0.1 to about 0.8 mole of the chain-extending agent with each mole of the bisimide in an organic solvent at a temperature of about 400° to 200° for a time of about 5 minutes to 5 hours. The bisimide can be, for example, a hydrazide-modified bismaleimide as described in U.S. Pat. Nos. 4,211,860 and 4,211,861. Suitable N,N'-unsaturated bismaleimide resins are commercially available from Technochemie GmbH as Compimide® resins, for example. The bisimide can be a mixture of bisimides described above tailored to meet specific processing requirements.

The invention composition includes a reactive triene characterized by a conjugated diene moiety capable of unhindered Diels-Alder reaction with the Y moiety of the above-described bisimide and an isolated double bond separated from the conjugated pair by a chemical linking group. Such trienes can be represented by one of formulas I and II:

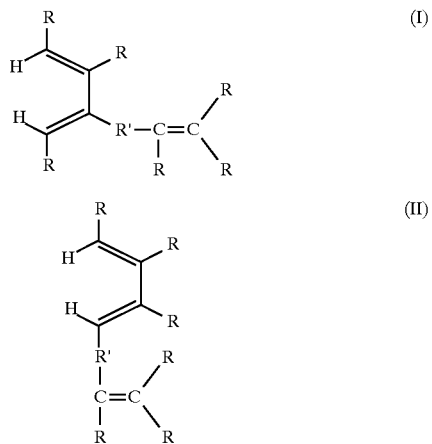

in which each R is selected independently from hydrogen and $C_{1-3}$ alkyl, and R' is a divalent linking group. R' can be, for example, alkylene, preferably $C_{2-12}$ alkylene; $-(\!(CH_2)_nR''(CH_2)_n\!)-$; and $-O-R''-O-$, in which n is an integer from 1 to about 6 and R'' is $C_{1-12}$ alkylene, carbonyl, phenylene, and the like. The preferred R' linking group is $C_{2-12}$ alkylene, as in myrcene and trans-1,3,7-octatriene. The conjugated diene group must be capable of Diels-Alder reaction with the Y moiety of the bisimide and must not contain substituents in positions which would block the approach of a Diels-Alder dienophile when the diene group is in the cisoid confirmation, as in cis-1,3,7-octatriene, for example. The isolated double bond should be adjoined by at least one hydrogen-bearing carbon atom. Because of the fracture toughness and high-temperature properties achievable in the resulting bisimide copolymer, myrcene is the preferred triene comonomer.

The bisimide and the triene are combined in a molar ratio of triene:bisimide within the range of about 0.2:1 to 1.0:1, preferably about 0.3:1 to about 0.9:1, most preferably about 0.4:1 to about 0.8:1, in order to achieve the desired physical properties in the cured composition.

The bisimide and triene may be combined in any manner desired, such as melt, solution or powder blending. The preferred technique involves melting a mixture of the solid reactants at a temperature above the respective melting points but below the polymerization temperature of either monomer, and stirring the melt until a homogeneous mixture is achieved.

The composition may contain an optional free radical inhibitor to inhibit free radical polymerization of the bisimide monomer. Generally, the free radical inhibitor will be present in the composition in an amount within the range of about 0.0002 to about 0.02 moles per mole of the bisimide, preferably from about 0.001 to about 0.01 moles. The free radical inhibitor can be added to the monomers in any manner effective for intimate blending of the monomers and free radical inhibitor. Free radical inhibitors include phenols such as t-butylcatechol, hydroquinone and p-methoxyphenol; quinones such as 1,4-benzoquinone and 1,4-naphthoquinone; polynitro aromatics such as picric acid and 2,4,6-trinitrotoluene; hydroxylamines such as diethylhydroxylamine; stable radicals such as di-t-butylnitroxide or diphenylpicrylhydrazyl; and certain polycyclic heterocycles such as phenothiazine. The preferred free radical inhibitor is phenothiazine.

Upstaging is effected by heating the mixture to a temperature effective to initiate reaction between the functional groups of the bisimide and the double bonds of the triene. The temperature is generally at least about 130° C., preferably within the range of about 150° to about 200° C., held for a time of about 2 hours or more, with the time dependent on the degree of upstaging desired. Suitable heat treatment involves subjecting the bisimide/triene mixture to the elevated temperature for a time sufficient to increase the viscosity (at 150° C.) to at least about 0.5 Pa.s, but not sufficient to gel the composition. The upstaged viscosity (at 150° C.) is preferably within the range of about 0.5 to about 10 Pa.s.

In order to achieve optimum properties in the copolymers, a mixture of the monomers and free radical inhibitor is heated at a temperature near or above the ultimate (fully cured) glass transition temperature of the copolymer composition for a time sufficient to produce essentially complete reaction of the monomers. "Essentially complete" reaction of the monomers has been reached when no further reaction exotherm is observed by differential scanning calorimetry (DSC) upon heating the copolymer. The time of the heat treatment, or "post-cure," will vary depending upon the monomers, the degree of pressure applied and any precuring of the monomer mixture.

The copolymers are useful as resin matrices for composites in aerospace and electronics applications, including large structural parts and circuit boards. Based on their long shelf life and relatively low melting point, some of the uncured mixtures are useful for making tacky prepregs which can then be molded into composites. They are also suitable for liquid resin processing methods such as filament winding, resin transfer molding, resin infusion molding, and pultrusion if the mixtures are heated to provide sufficiently low viscosity for fiber impregnation. The low dielectric constants of the cured copolymers make them suitable for electrical applications such as the manufacture of circuit boards.

The invention composition can, for applications such as prepregging, include an organic solvent or diluent present in an amount effective to decrease the viscosity of the system for easier processing. Suitable solvents include ketones, alcohols and glycol ethers having boiling points less than about 135° C., preferred for prepregging because they are more readily removed from the composition at relatively low temperatures and at a relatively early stage of the prepregging process. The preferred solvents are ketones such as acetone, methyl ethyl ketone and methyl isobutyl ketone, for example, and glycol ethers such as ethylene glycol monomethyl ether, ethylene glycol monoethyl ether, and propylene glycol monomethyl ether. Also suitable are low-boiling alcohols such as methanol, ethanol, isobutanol and propanol. Higher-boiling solvents such as dimethyl formamide and N-methyl pyrrolidone can be used but are less desirable and will generally be used in mixed solvent systems with the above low-boiling solvents. For prepregging applications, the solvent will generally constitute at least about 15 weight percent of the total weight of the solution. Preferably, the solvent will be present in the solution in an amount within the range of about 15 to about 50, most preferably about 30 to about 45 weight percent. The resin component and optional accelerator can be stirred into the selected solvent at ambient temperature or with optional mild heating not greater than about 40° C. to form the "varnish," or prepregging formulation.

For preparation of electrical laminate materials from the varnish, a porous substrate, usually a glass fiber web, is impregnated with a bisimide/triene composition in molten or solution form. A prepreg is formed by heating the impregnated substrate in an oven at a temperature sufficient to remove the solvent and optionally to partially cure without gelation, or "B-stage," the resin system, generally about 180° C. to about 230° C., preferably about 200° to about 220° C., for a time of up to about 2 hours, preferably about 10 to about 40 minutes. A laminate is fabricated by subjecting a set of layered prepregs to conditions effective to cure the resins and to integrate the prepregs into a laminated structure. The laminate can optionally include one or more layers of a conductive material such as copper. Laminating generally involves subjecting the prepregs to a temperature above about 200° C., preferably from about 210° to about 350° C., for a time of at least about 1 hour, at a pressure within the range of about 50 to about 500 psi.

EXAMPLE 1

Bis (4-maleimidophenyl)methane (MDAB) (1209.36 g), myrcene (SCM Glidco P&F grade, 252.64 g) and phenothiazine (3.60 g) were weighed into a 3.5-L stainless steel beaker with a handle. The beaker was heated in an oil bath at approximately 150° C., with stirring, until the contents were liquid and homogeneous (about 10 minutes). The mixture was then poured into aluminum trays and allowed to cool to room temperature and solidify. The solidified material was broken into chunks, stored, and used for upstaging as follows.

Four approximately 100-gram portions of the above material were placed into 150-mL beakers which were then lowered into a 150° C. oil bath. As soon as the resin had melted, the spindle of a Brookfield viscometer was then lowered into the beaker. Viscosity was measured continuously as the resin was held at 150° C. until the desired viscosity was reached. The beaker was then removed from the oil bath and the upstaged resin was poured into an aluminum tray and allowed to cool to room temperature and solidify. The solidified material was then placed into a jar and used in the following acetone-solubility study. Viscosity and upstaging time of the four resin samples are shown in Table 1 below.

TABLE 1

| Sample | Upstaging Time (hr.) | Final Visc. (Pa · s) |
|--------|----------------------|----------------------|
| 1      | 8.8                  | 4.0                  |
| 2      | 7.6                  | 2.0                  |
| 3      | 6.0                  | 1.0                  |
| 4      | 5.3                  | 0.5                  |

The four resin samples from Table 1, along with a sample given no upstaging, were then combined with acetone in vials at different ratios of resin to acetone. The mixtures were shaken at room temperature until homogeneous. They were then allowed to stand at room temperature and were periodically inspected for the appearance of any crystalline precipitate. Table 2 below shows the compositions of the solutions and the times at which crystallization was first detected.

TABLE 2<sup>a</sup>

|        | % Resin in Solution | | |
|--------|------|------|------|
| Sample | 50   | 60   | 70   |
| Non-upstaged | 73 | 3 | 3 |
| 1      | none | 50   | 5    |
| 2      | none | none | 50   |
| 3      | none | none | 50   |
| 4      | none | none | b    |

<sup>a</sup>Number of days to first appearance of a precipitate in an acetone solution of the resin of the indicated viscosity at the indicated resin concentration. "None" indicates that no precipitate was seen after 105 days.
<sup>b</sup>Very slight precipitate at 105 days.

As can be seen from Table 2, the tendency to crystallize from acetone solution for the bismaleimide/myrcene adduct decreases with increasing degree of upstaging over the tested range of resin concentrations.

I claim:

1. A process comprising:
   (1) providing a monomer mixture comprising (a) a bisimide of an unsaturated dicarboxylic acid which bisimide can be represented by the formula

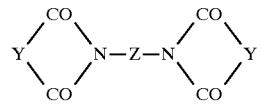

in which Y is a substituted or unsubstituted divalent group containing at least 2 carbon atoms and a carbon-carbon double bond, and Z is a divalent linking group, and (b) a triene which contains both a conjugated diene moiety capable of unhindered Diels-Alder reaction with a Y group of the bisimide and a carbon-carbon double bond separated from the conjugated pair by a divalent linking group; and (2) subjecting said monomer mixture to a non-gelling elevated temperature for a time sufficient to increase the viscosity of the mixture and to enhance the solubility thereof in an organic solvent.

2. The process of claim 1 in which the triene is represented by one of formulas I and II

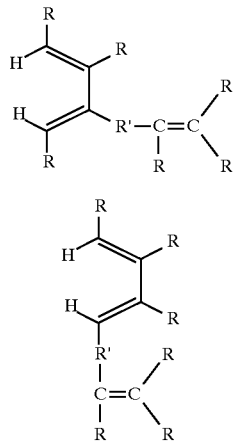

in which each R is selected independently from the group consisting of hydrogen and $C_{1-3}$ alkyl, R' is a divalent linking group, and the double bond separated from the conjugated pair adjoins at least one hydrogen-bearing carbon atom.

3. The process of claim 2 in which R' is $C_{2-12}$ alkylene.

4. The process of claim 3 in which each R is selected from the group consisting of hydrogen and methyl.

5. The process of claim 2 in which R' is —O—R"—O—, in which R" is selected from the group consisting of $C_{2-12}$ alkylene and phenylene.

6. The process of claim 1 in which the triene is myrcene.

7. The process of claim 1 in which the molar ratio of the triene to the bisimide is within the range of about 0.2–1.0:1.

8. The process of claim 7 in which the triene is myrcene.

9. The process of claim 8 in which the bisimide comprises N,N'-4,4'-diphenylmethane bismaleimide.

10. The process of claim 1 which further comprises from about 0.0002 to about 0.2 moles, per mole of the bisimide, of a free radical polymerization inhibitor.

11. The process of claim 10 in which the free radical polymerization inhibitor is phenothiazine.

12. The process of claim 9 in which the molar ratio of the myrcene to the bisimide is within the range of about 0.4–0.8:1.

13. The process of claim 1 in which the elevated temperature of step (b) is within the range of about 130° to about 200° C.

14. The process of claim 9 in which step (b) is carried out for a time sufficient to produce a thermosettable, partially-cured mixture having a viscosity within the range of about 0.5 to about 10 Pa.s.

15. The process of claim 9 in which step (b) comprises heating the mixture at a temperature within the range of about 130° to about 200° C. for a time of 2 to about 20 hours.

* * * * *